United States Patent [19]

Heller

[11] 4,035,667
[45] July 12, 1977

[54] INPUT CIRCUIT FOR INSERTING CHARGE PACKETS INTO A CHARGE-TRANSFER-DEVICE

[75] Inventor: Lawrence Griffith Heller, Brewster, N.Y.

[73] Assignee: International Business Machines Corporation, Armonk, N.Y.

[21] Appl. No.: 636,862

[22] Filed: Dec. 2, 1975

[51] Int. Cl.² .................. G11C 19/28; H01L 29/78
[52] U.S. Cl. ............................... 307/221 D; 357/24
[58] Field of Search .......... 357/24; 307/221 D, 304

[56] References Cited

U.S. PATENT DOCUMENTS 3,881,117  9/1975  Tompsett .............................. 357/24

OTHER PUBLICATIONS

Tompsett et al., "Use Of Charge–Coupled Devices For Delaying Analog Signals", IEEE J. Solid State Circuits, vol. SC–8, (Apr. 1973), pp. 151–157.
Emmons et al., "Noise Measurements On The Floating Diffusion Input For Charge–Coupled Devices", J. Applied Physics, vol. 45, (Dec. 1974), pp. 5303–5306.
Emmons et al., "A Low–Noise CCD Input With Reduced Sensitivity To Threshold Voltage", Int. Electron Devices Meeting Tech. Dig., (Dec. 1974), pp. 233–235.
Sequin et al., "Linearity Of Electrical Charge Injection Into Charge Coupled Devices", Int. Electron Devices Meeting Tech. Dig., (Dec. 1974), pp. 229–232.

Primary Examiner—William D. Larkins
Assistant Examiner—Gene M. Munson
Attorney, Agent, or Firm—John J. Goodwin

[57] ABSTRACT

An input circuit for a charge-transfer-device such as a bucket-brigade or charge-coupled-device incorporating an input terminal connected to an input diode source diffusion of the charge-transfer-device through a capacitor C. The nonlinear depletion capacitance $C_d$ associated with the input circuit is schematically shown connected in parallel with C at a first node. The nonlinear capacitance $C_d$, which is parasitic, is a basic cause of distortion of the input charge packets. The input circuit further includes an active device such as an IGFET connected in parallel with the input terminal to provide a supply of charge carriers. The gate of the active device is connected to a reset signal source.

4 Claims, 2 Drawing Figures

INPUT CIRCUIT FOR INSERTING CHARGE PACKETS INTO A CHARGE-TRANSFER-DEVICE

BACKGROUND OF THE INVENTION

1. Field of the Invention

The present invention relates generally to charge-transfer-device structures and more particularly to an improved input circuit for inserting charge packets into a charge-transfer-device structure.

2. Description of the Prior Art

A number of techniques for inserting charge packets into a charge-transfer-device are known in the prior art. A review of some of these techniques are set forth in the publication entitled "Use of Charge-Coupled Devices For Delaying Analog Signals," Michael F. Tompsett and Edward J. Zimany, Jr., IEEE Journal of Solid State Circuits, Vol. SC-8, No. 2, Apr. 1973.

In this publication it is stated that in one injection technique the input signal is capacitively coupled to the input diode of the charge-coupled device and the input gate is held positively biased. When the first transfer electrode is pulsed on, a potential well, or virtual drain is created with respect to the input diode or source. A current that is dependent on the potential of the input diode then flows into the well from the diode. When the first transfer electrode turns off, the current flow stops and the generated charge packet transfers along the device. In this mode of controlling the input of charge into the device, the signal may be applied either to the input diode, as indicated already, or the diode may be held at a fixed bias and the signal applied to the input gate. An alternative method is to let the input signal modulate an external current source and apply the current to the input diode.

Another way to control the size of the charge packets is to set the surface potential of the inverted region under the first transfer electrode when charge has come to equilibrium. This may be done by strongly biasing the input gate on and applying the signal to the input diode. The following sequence may be used. The input signal is applied to the input gate and the input diode is pulsed each cycle to a low value so as to completely fill the region under the first transfer electrode with charge. The input diode is returned to a strongly reverse biased state. Excess charge then flows from the region under the first transfer electrode until the potential of this region equals the potential under the input gate. Hence the potential under the first transfer electrode containing the charge packet and therefore the amount of charge in the packet is controlled by the difference potential in the input gate and the first electrode and is independent of the flatband voltage.

In all these methods, charge samples dependent on the input signal can be formed and passed along the device. In addition, the signal level may be adjusted so that small background or bias charge packets are obtained even when the analog signal is zero. This is necessary so as to keep the interface states filled in the absence of signal and to obtain the best transfer efficiency from the device.

The choice of a particular method to input charge into a CCD would normally be made on the basis of maximizing the linearity and reducing harmonic distortion in the delayed signal. However, all methods known heretofore in the prior art have some factor causing nonlinearity. The present invention, on the other hand, provides a technique which does not depend on threshold and is therefore essentially distortionless and precise.

SUMMARY OF THE INVENTION

An object of the present invention is to provide an improved input circuit for linearly injecting charge packets into a charge-transfer-device.

Another object of the present invention is to provide a distortionless charge injection circuit for charge-transfer-devices.

A further object of the present invention is to provide a distortionless charge injection circuit for charge-transfer-devices which is independent of the input circuit threshold and capacitance.

The foregoing and other objects, features and advantages of the invention will be apparent from the following more particular description of a preferred embodiment of the invention, as illustrated in the accompanying drawings.

DESCRIPTION OF THE PREFERRED EMBODIMENTS

The use of charge-transfer-devices such as charge-coupled-devices and bucket-brigade structures are particularly useful for storing analog signals because of their large dynamic range. However, injection of charge packets into a charge-transfer-device is subject to distortion because of the nonlinear depletion capacitance $C_d$ associated with input circuit of the device which results from the inherent parasitic effects between the $n+$ diffusion and the substrate. Another cause of distortion is the threshold and capacitances of the input circuit.

Figure 1:
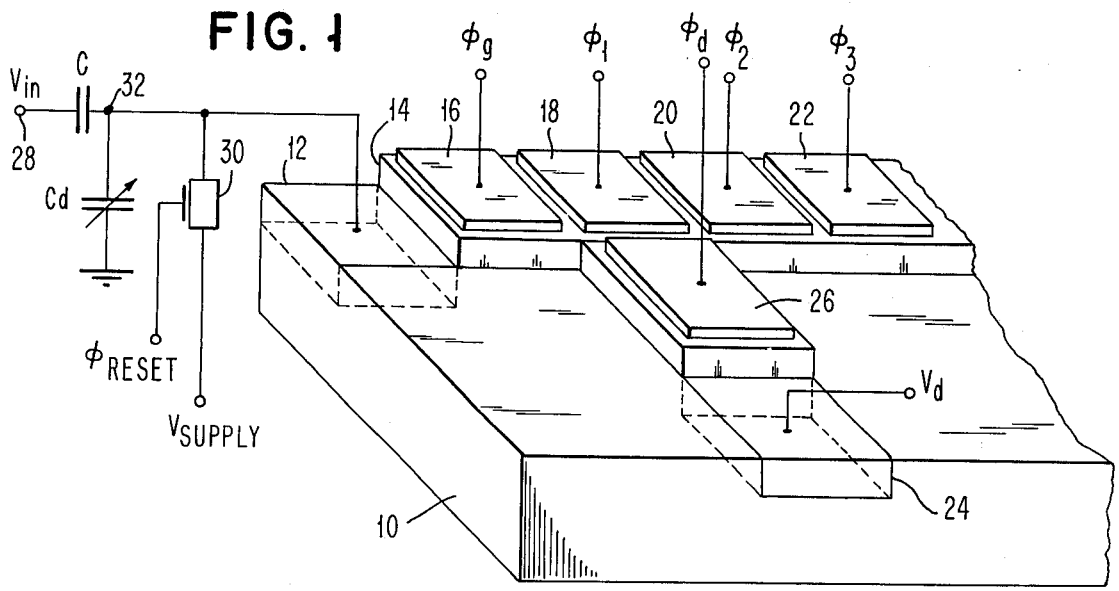
FIG. 1 is a partial perspective illustration and partial schematic diagram of an embodiment of an input circuit for inserting charge packets into a charge-transfer-device according to the principles of the present invention.

The present invention as embodied in FIG. 1 eliminates the aforesaid distortion conditions and permits the insertion of a packet of charge carriers Q into a charge-transfer-device which is directly proportional to $\Delta V$ the input signal voltage to the device. Referring to FIG. 1, a charge-transfer-device embodied as a charge-coupled-device is illustrated including a semiconductor substrate 10 which may be composed of silicon. An $n+$ source diffusion 12 is formed in substrate 10. A layer of insulation 14 such as silicon dioxide is located on substrate 10 and a plurality of gates electrodes 16, 18, 20, 22 etc. are located above insulating layer 14 and are connected respectively to phase signals sources $\phi_a$, $\phi_1$, $\phi_2$, $\phi_3$ etc. Phase signal $\phi_a$ is the input signal to electrode 16 which forms an IGFET input diode with substance 10. Gate electrodes 18, 20, 22 etc. represent the stages of a charge-coupled-device shift register as a typical example of a utilization device. A drain diode 24 composed of $n+$ type material is also formed in substrate 10 and is connected to a source of diode voltage $V_d$. Drain diode 24 is coupled to the other circuits through a gate including a gate electrode 26 which is separated from substrate 10 by the insulating layer 14 and is connected to a drain phase signal source $\phi_d$. The illustration of the combination of the substrate 10, insulating layer 14 and the electrodes 16, 18, 20, etc., is shown for simplicity, and one skilled in the art will appreciate that in the actual physical structure of the device the insulating layer also extends over the remainder of the substrate and has a height greater than the height of the electrodes, which are recessed in the silicon dioxide. Likewise the electrodes physically tend to extend up the surface of the silicon dioxide do not have as clearly planar geometry as indicated.

An input terminal at which the analog input voltage signal is applied is connected through a capacitor C to the input source diffusion 12. The nonlinear depletion capacitance $C_d$ due to the parasitic effect between the $n+$ region 12 and substrate 10 is physically represented as $C_d$ in FIG. 1. An active device 30 connects a voltage V supply to the source diffusion 12 and is controlled by a reset pulse $\phi$reset connected to its gate electrode.

Figure 2:
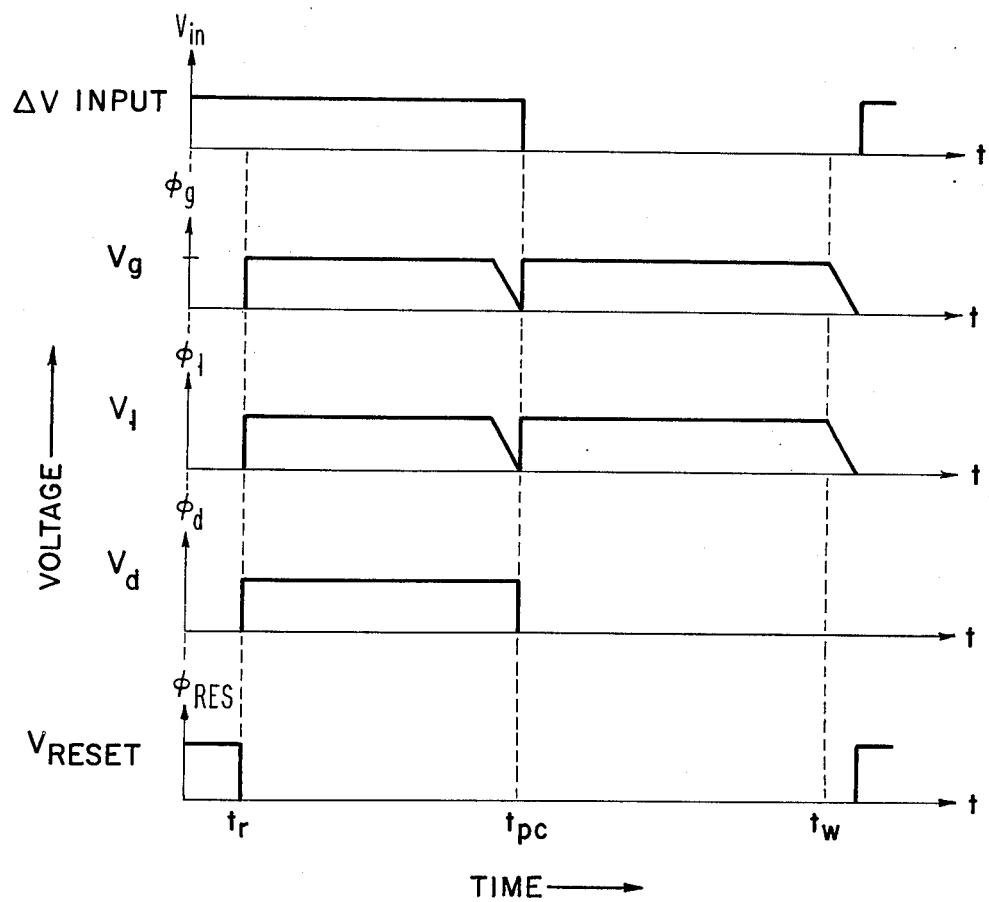
FIG. 2 is a illustration of a series of waveforms used in explaining the operation of the embodiment of FIG. 1.

In operation, a precharge period first takes place at $t_r$ (see FIG. 2) by $\phi$reset going off and gating V supply through active device 30 and setting the potential of the source diffusion $V_s$ (appearing at node 32) to a level $V_R$ where $V_R$ is less than $V_g - V_{th}$ where $V_g$ is the amplitude of the input gate signal $\phi_g$ and $V_{th}$ is the amplitude of the threshold of the IGFET input diode. $\phi_g$ can have the waveform indicated in FIG. 2 or be held constant at $V_g$. During the precharge period, that is, the time interval between $t_r$ and $t_{pc}$ (of FIG. 2), $V_s$ at node 32 increases up to $V_g - V_{th} = V_R$ due to charge carrier flow from source diffusion 12 and the excess charge carriers which are approximately equal to $(V_R - V_{supply})(C + C_d)$ flow down the staircase potential hill under $\phi_g$, $\phi_1$, and $\phi_d$ and are drained off the drain diode 24 and flow out to $V_d$. At time $t_{pc}$ no inversion charge exists under electrodes 16, 18, 20, or 26.

An input signal $\Delta V$ which is a negative transient and is applied to terminal 28 is coupled into node 32 through capacitor C during the time interval between $t_{pc}$ and before $t_w$. The input signal $\Delta V$ couples a voltage approximately equal to $\Delta VC/(C + C_d)$ from node 32 and then the input diffusion region 12 (and node 32) charges back up to $V_R$ thereby inserting a packet of charge carriers of $Q = C\Delta V$ into the first shift register potential well under electrode 18, which is now isolated from the drain diode. The packet of charge carriers Q thus injected into the shift register is equal to $C\Delta V$ because the input diffusion region (and node 32) is at a potential of $V_R$ at time $t = t_{pc}$ and $t = t_w$. Thus, it can be seen that the charge Q inserted into the shaft register is equal to $C\Delta V$ and is independent of both the non-linear capacitance $C_d$ and the threshold $V_{th}$ but is linearly dependent on the input signal $\Delta V$. Since C can be precisely controlled the structure of FIG. 1 shows an input circuit wherein precise, undistorted packets of charge carriers can be injected into a charge-coupled-device. Also, since Q is independent of $C_d$ and $V_{th}$, identical charge packets can be injected into adjacent shift registers connected to C. Another advantage of the present invention is that since Q is linearly dependent only on $\Delta V$ and C, the value of C can be selected to represent data such as a digital value and the amount of Q that is injected, being determined by C, is an analog representation of the digital value.

It should be appreciated that one skilled in the art of IGFET bucket-brigade structures that the principles of the present invention apply to and can be practiced with such structures.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An input circuit for entering quantities of electrical charge carriers into a solid-state charge-transfer-device of the type having a semiconductor substrate and a plurality of charge transfer means for moving quantities of electrical charge carriers in a controlled manner across said substrate, said input circuit comprising:
   a source diffusion means located on said semiconductor substrate and producing an inherent depletion capacitance $C_d$,
   an input lead connected to said source diffusion means,
   a capacitor C connected in series with said input lead,
   an active device connected between a supply voltage and said input lead, said active device being controlled by a source of reset signal to couple said supply voltage to said source diffusion to raise the potential of said source diffusion to equal a predetermined first precharge potential
   means for providing an input voltage $\Delta V$ which is applied and coupled through said capacitor C to said input lead to vary the potential of said source diffusion for producing and inserting into said charge-transfer-device a quantity of charge carriers Q directly proportional to said capacitor C and said input voltage $\Delta V$ and independent of said depletion capacitance $C_d$,
   and an electrical charge drain means located on said semiconductor substrate to remove charge carriers produced by said diffusion when said source diffusion is equal to said predetermined first precharge potential.

2. An input circuit according to claim 1 wherein said charge-transfer-device further includes an input gate proximate to said source diffusion which is operated by a gate signal $\phi g$ having an amplitude $V_g$ and which forms with said source diffusion an insulated gate input diode which has a threshold potential $V_{th}$.

3. An input circuit according to claim 2 wherein said source diffusion is precharged to a potential of $V_R = V_g - V_{th}$ by charge carrier flow from said source diffusion and wherein excess charge carriers produced by said source diffusion substantially equal to $(V_R - V_{supply})(C + C_d)$ are removed by said electrical charge drain means such that no inversion charge exists in the input circuit.

4. An input circuit according to claim 3 wherein said $\Delta V$ input voltage on said input lead couples a voltage substantially equal to $\Delta VC/(C + C_d)$ to said source diffusion to lower the potential of said source diffusion, wherein said potential of said source diffusion increases back to $V_R$. Thereby producing a quantity of charge carriers equal to $Q = C\Delta V$ in a potential well of said charge transfer device.

* * * * *